United States Patent [19]

Nebel et al.

[11] Patent Number: 5,703,533
[45] Date of Patent: Dec. 30, 1997

[54] BICMOS OPERATIONAL AMPLIFIER FOR SWITCH/CAPACITOR CIRCUITS

[75] Inventors: Gerhard Nebel, Immenstadt; Georg Georgakos, Fraunberg; Ulrich Kleine, Unterhaching, all of Germany

[73] Assignee: Siemens Aktiengesellschaft, Munich, Germany

[21] Appl. No.: 612,874

[22] PCT Filed: Sep. 7, 1994

[86] PCT No.: PCT/DE94/01027

§ 371 Date: Mar. 12, 1996

§ 102(e) Date: Mar. 12, 1996

[87] PCT Pub. No.: WO95/08215

PCT Pub. Date: Mar. 23, 1995

[30] Foreign Application Priority Data

Sep. 15, 1993 [DE] Germany .................. 43 31 362.0

[51] Int. Cl.⁶ .................. H03F 3/45; H03F 3/16
[52] U.S. Cl. .................. 330/253; 330/300
[58] Field of Search .................. 330/9, 51, 253, 330/292, 300

[56] References Cited

U.S. PATENT DOCUMENTS 5,028,881  7/1991  Jackson .................. 330/253
5,477,190  12/1995  Brehmer et al. .................. 330/300 X Primary Examiner—Steven Mottola
Attorney, Agent, or Firm—Hill, Steadman & Simpson

[57] ABSTRACT

The operational amplifier which has a high input impedance as well as a high bandwidth, is designed particularly for capacitive loads and, above all, maintains its operating point within narrow limits irrespective of technological fluctuations. The BiCMOS amplifier uses bipolar cascades (Q6, Q16, Q7, Q17) as output paths which are driven at high impedance, via PMOS cascade transistors (M6, M7), directly by the differential amplifier transistor pair (M4, M5), as a result of which a current is output and the maintenance of the operating point of the operational amplifier is ensured even when technological fluctuations are taken into account.

7 Claims, 1 Drawing Sheet

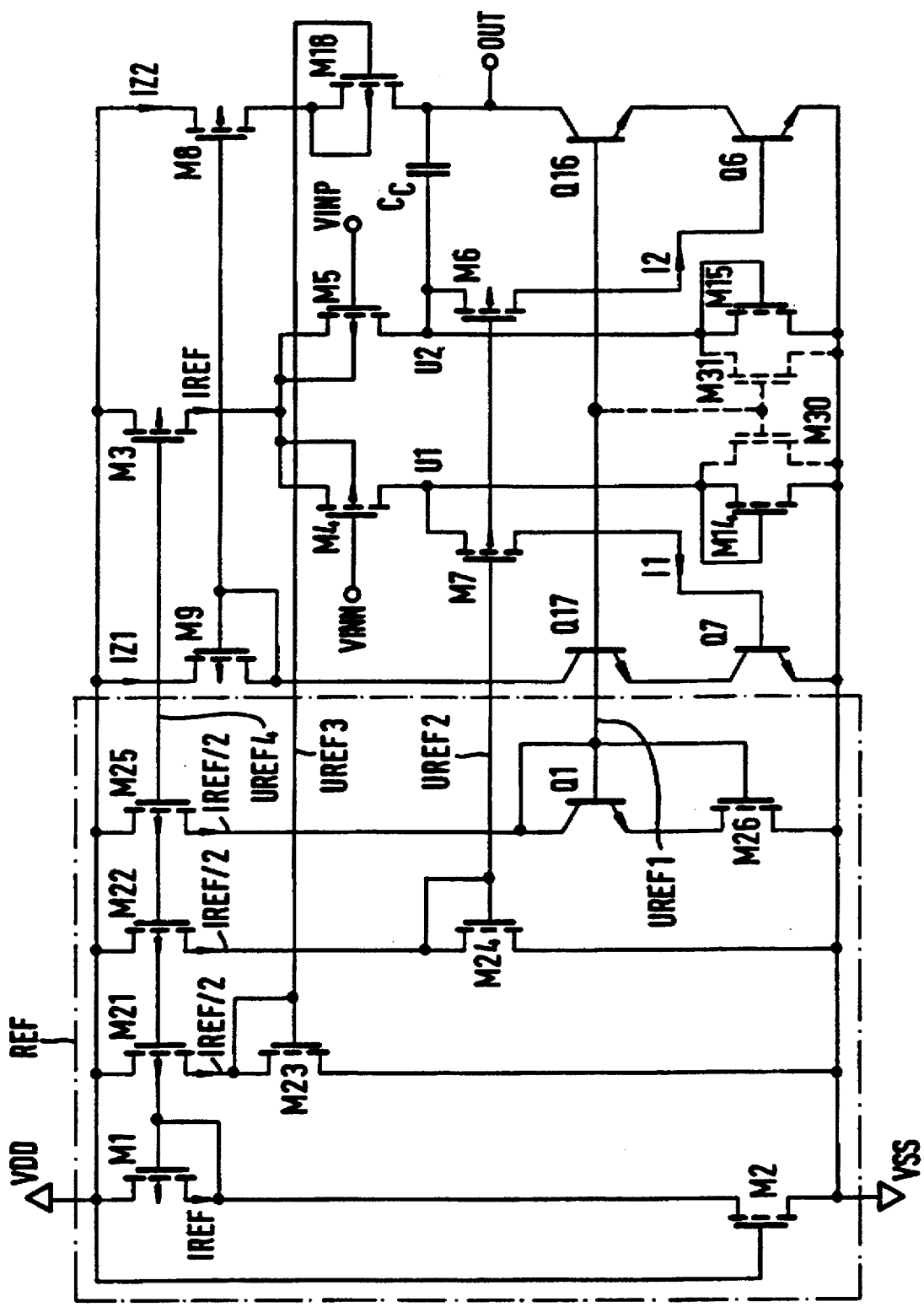

BICMOS OPERATIONAL AMPLIFIER FOR SWITCH/CAPACITOR CIRCUITS

BACKGROUND OF THE INVENTION

Integrated operational amplifiers for switch/capacitor (SC) circuits were formerly realized purely using CMOS technology. However, these circuits require more chip area and generally require a greater outlay than BiCMOS amplifiers. It is possible to achieve higher bandwidths and higher output impedances with BiCMOS amplifiers by virtue of the better analog properties with regard to transconductance and output impedance of a bipolar transistor compared with an MOS transistor. By additionally using bipolar transistors which have a higher transconductance than MOS transistors, amplifiers having a high bandwidth and high gain can be realized considerably more easily and with a lower area requirement. MOS transistors are voltage-controlled components, whereas bipolar transistors are current-controlled components. When coupling bipolar transistors to an MOS amplifier stage, therefore, special circuit techniques are required in order to guarantee the operating points of the bipolar transistors even in the event of fluctuations in the production process.

An operational amplifier of the generic type is disclosed in IEEE Journal Of Solid-State Circuits, vol. 26, No. 3, March 1991, New York US, pages 203 to 208.

Furthermore, the American patent specification U.S. Pat. No. 3 644 838 discloses an operational amplifier in which use is made of an IGFET instead of a lateral bipolar transistor in order to increase the pass bandwidth.

SUMMARY OF THE INVENTION

The invention is based on the object, then, of specifying a BiCMOS operational amplifier which has a high input impedance as well as a high bandwidth, is particularly suitable for SC circuits and, above all, ensures the maintenance of the operating points of the bipolar transistors in the output path of the operational amplifier even when technological fluctuations are taken into account.

In general terms the present invention is a BiCMOS operational amplifier for switch/capacitor circuits. There is provided an MOS differential amplifier stage, which is supplied with a reference current by a current source and which has a load element in each of the two paths of the MOS differential amplifier stage. Two output paths are provided which each comprise a series circuit formed by a further load element and two bipolar transistors, the respective bipolar transistors forming a cascade. The base of each of the bipolar transistors is supplied with a first reference voltage and one of the further load elements is connected to an output of the operational amplifier, characterized in that a respective bipolar transistor of a respective cascade can be driven, via a respective PMOS transistor to whose respective gate a second reference voltage is applied, directly by a voltage across the load element of the respective path of the MOS differential amplifier stage.

Advantageous developments of the present invention are as follows.

The reference current through the MOS differential amplifier stage is selected such that it is less than or equal to the respective currents in the output paths. The output of the operational amplifier is fed back to an output of the MOS differential amplifier stage via a compensation capacitance.

The load elements in the output paths each have a transistor and these transistors are connected in the form of a current mirror. The load element connected to the output of the operational amplifier has an additional load element which is connected in series with the respective transistor of the current mirror.

The additional load element consists of an MOS transistor whose gate can be driven by a third reference voltage.

The current source for the reference current consists of a PMOS transistor whose gate can be driven by a fourth reference voltage.

The first, second, third and fourth reference voltages can be formed in a reference unit. The first reference voltage is applied to the base of a first bipolar transistor, the emitter of which transistor is connected to an external reference potential via a first NMOS transistor, the collector of which transistor is connected to a supply voltage via a first PMOS transistor, and the base of which transistor is connected to the collector of the bipolar transistor and to the gate of the first NMOS transistor. The second reference voltage is applied to the gate of a second NMOS transistor, the first terminal of which transistor is connected directly to the external reference potential, the second terminal of which transistor is connected to the supply voltage via a second PMOS transistor, and the gate of which transistor is connected to the second terminal of the second NMOS transistor. The third reference voltage is applied to the gate of a third NMOS transistor, the first terminal of which transistor is connected directly to the external reference potential, the second terminal of which transistor is connected to the supply voltage via a third PMOS transistor, and the gate of which transistor is connected to the second terminal of the third NMOS transistor. The fourth reference voltage is applied to the gates of the first, second and third PMOS transistors and of a fourth PMOS transistor, the first terminal of which transistor is connected directly to the supply voltage, the second terminal of which transistor is connected to the external reference potential via a fourth NMOS transistor, and the gate of which transistor is connected to the second terminal of the fourth PMOS transistor, the gate of the fourth NMOS transistor being connected to the supply voltage.

The load elements in the paths of the MOS differential amplifier comprise NMOS transistors which are connected as diodes.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with accompanying drawing, in which:

The single FIGURE is a circuit diagram of a BiCMOS operational amplifier according to the invention.

DESCRIPTION OF THE PREFERRED EMBODIMENTS

The inventive operational amplifier illustrated in the single FIGURE has as its input stage an MOS differential amplifier stage having two PMOS transistors M4 and M5, the source and substrate terminals of which transistors M4 and M5 are each connected to a supply voltage VDD via a current source for a reference current IREF, and the drain terminals of which transistors M4 and M5 are each connected to the reference potential VSS via load elements. The inverting input VINN of the operational amplifier according to the invention is connected to the gate of the MOS transistor M4, and the non-inverting input of the operational amplifier according to the invention is connected to the gate of the MOS transistor M5. A first output voltage U1 of the MOS differential amplifier is applied to the drain of the MOS transistor M4, and a second output voltage U2 of the MOS differential amplifier is applied to the drain of the MOS transistor M5.

The drain terminal of the transistor M4 is connected to the base of a bipolar transistor Q7 via a PMOS transistor M7 whose gate receives a reference voltage UREF2, as a result of which a control current I1 is output. In a corresponding manner, the drain terminal of the transistor M5 is connected to the base of a bipolar transistor Q6 via a PMOS transistor M6 whose gate is likewise supplied with the reference voltage UREF2, as a result of which a control current I2 is output.

The bipolar transistor Q7 is part of a first output path which has a further bipolar transistor Q17, the base of which is supplied with a reference voltage UREF1, and a load element. The bipolar transistor Q6 is correspondingly part of a second output path which, in addition, has a bipolar transistor Q16, the base of which is supplied with a reference voltage UREF1, and a further load element. The transistors Q17 and Q7 form a cascade, the collector of the transistor Q17 being connected to the load element, the emitter of the transistor Q17 being connected to the collector of the transistor Q7, and the emitter of the transistor Q7 being connected to the reference potential VSS. The transistors Q16 and Q6 likewise form a cascade, the collector of the transistor Q16 being connected to the further load element, the emitter of the transistor Q16 being connected to the collector of the transistor Q6, and the emitter of the transistor Q6 being connected to the reference potential VSS. A current IZ1 flows in the first output path, which is formed by the load element and the transistors Q17 and Q7, and a current IZ2 flows in the other output path, which is formed by the further load element and the transistors Q16 and Q6. The collector terminal of the transistor Q16 forms the output OUT of the operational amplifier according to the invention.

As a rule, the operational amplifier according to the invention is operated as a two-stage amplifier, the current IREF fed to the MOS differential amplifier stage being less than or equal to the currents IZ1 or IZ2 in the output paths. In this case, a compensation capacitance CC is required between the output OUT of the operational amplifier according to the invention and the drain terminal of the transistor M5 of the MOS differential amplifier, for the purpose of frequency compensation.

In the event that the operational amplifier according to the invention is operated as a single-stage amplifier, the current IREF being greater than the current IZ1 or IZ2 in the output paths, this compensation capacitance CC is not required since, owing to the fact that the paths of the MOS differential amplifier have a lower impedance in this case, the frequency response of the operational amplifier according to the invention is determined by the ratios at its output OUT and, as a result, the frequency compensation can be effected by a load capacitance which can be driven at the output OUT.

The load elements situated in the paths of the MOS differential amplifier can be realized by NMOS transistors M14 and M15 which are connected as diodes, a respective first terminal of the respective NMOS transistor being connected to the reference potential VSS, and a respective second terminal and a respective gate terminal being connected to a respective output of the MOS differential amplifier. The low-impedance diodes, which are formed by the transistors M14 and M15, are used for additional operating point stabilization.

In order to produce a symmetrical current division in the two output paths, the load elements of the output paths can be designed in the form of a current mirror with two PMOS transistors M8 and M9, the transistor M8 being connected in series with the cascade formed by the transistors Q16 and Q6, and the transistor M9 being connected in series with the cascade formed by the transistors Q17 and Q7, and the gates of the two transistors M8 and M9 being connected to the collector of the transistor Q17.

In order to increase the output load impedance of the operational amplifier according to the invention, the further load element can contain an additional load element. The additional load element in this case advantageously consists of a PMOS transistor M18, the first terminal of which transistor M18 is connected to the output OUT of the operational amplifier according to the invention, the substrate terminal and second terminal of which transistor M18 are connected to the further load element of the output path, and the gate terminal of which transistor M18 receives a reference voltage UREF3.

The current source for the current IREF can be realized, for example, by a PMOS transistor M3, the first terminal of which transistor M3 is connected to the supply voltage VDD, the second terminal of which transistor M3 is connected to the source terminals of the transistors M4 and M5, and the gate of which transistor M3 is supplied with a reference voltage UREF4.

The reference voltages UREF1 . . . UREF4 are advantageously formed in a reference unit REF.

The reference unit REF has an NMOS transistor M2, the first terminal of which transistor M2 is connected to the reference potential, the second terminal of which transistor M2 is connected to gate terminals of p-channel transistors M1, M21, M22 and M25 and also to a first terminal of the transistor M1, the second terminal of the transistor M1 being connected to the supply voltage VDD, and the gate of which transistor M2 is connected to the supply voltage VDD. In this case, the transistor M2 operates in the triode region and draws a reference current via the transistor M1, which reference current is mirrored, via the transistor M3, as far as possible in the ratio 1:1 in the input differential stage, and in the ratio 2:1 in other reference voltage paths which each contain one of the transistors M21, M22 or M25 and through which a current IREF/2 flows. The selected ratio 2:1 is not critical here and may be selected, for instance, in a range of 1:1 to 4:1.

The reference voltage UREF4 is applied to the gates of the transistors M1, M21, M22 and M25.

Together with an NMOS transistor M23, the transistor M21 forms a reference voltage path for the reference voltage UREF3, the drain terminal of the transistor M21 being connected to the drain terminal and the gate terminal of the transistor M23, and the source terminal of the transistor M23 being connected to the reference potential VSS.

Correspondingly, the transistor M22, together with an NMOS transistor M24, forms a reference voltage path for forming the reference voltage UREF2, the drain terminal of the transistor M22 being connected to the drain terminal and the gate terminal of the transistor M24, and the source terminal of the transistor M24 being connected to the reference potential VSS.

The reference voltage path for forming the reference voltage UREF1 contains, in addition to the transistor M25, a bipolar transistor Q1 and an NMOS transistor M26, the drain terminal of the transistor M25 being connected to the collector and the base of the bipolar transistor Q1 and to the gate of the transistor M26, and the emitter being connected to the reference potential VSS via the transistor M26. The reference voltage should be about 2 UBE or less, but always greater than 1 UBE, in order that Q6 and Q7 do not reach saturation.

If M26 were a bipolar transistor, then 2 UBE≈1.7 V. However, since the amplifier operates, for example, only with 3.3 V, it is practical to select UREF1 to be smaller, in order to increase the modulation range. UREF1 can be set in the specified range by means of the MOS transistor M26 using the width/length ratio, and is 1.1 V, for example.

The reference voltage UREF1 can be tapped on the gate of the transistor M26, the reference voltage UREF2 can be tapped on the gate of the transistor M24 and the reference voltage UREF3 can be tapped on the gate of the transistor M23.

A further variant, in which a portion of the diode currents is passed via parallel-connected NMOS current sources in order to increase the total load impedance somewhat, is indicated in the drawing by the NMOS transistors M30 and M31 which are drawn with dashed lines.

In this case, the transistor M30 is connected in parallel with the transistor M14 and the transistor M31 is connected in parallel with the transistor M15, and the gates of the transistors M30 and M31 are connected to a reference voltage, in this case to UREF1, for example.

Since less current flows via the diodes, the width/length ratio can be reduced, as a result of which the impedance increases. The parallel current sources have a substantially higher impedance, with the result that the parallel circuit still has a higher impedance than the diodes alone.

The invention is not limited to the particular details of the apparatus depicted and other modifications and application are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A BiCMOS operational amplifier for switched capacitor circuits, comprising
   an MOS differential amplifier stage, which is supplied with a reference current by a current source and which has a respective load element in each of two paths of the MOS differential amplifier stage;
   two output paths each of the two output paths having a respective series circuit formed by a respective further load element and two respective bipolar transistors, the respective bipolar transistors forming a cascade;
   the base of each of the bipolar transistors being supplied with a first reference voltage and one of the further respective load elements being connected to an output of the operational amplifier;
   a respective bipolar transistor of a respective cascade can be driven, via a respective PMOS transistor to whose respective gate a second reference voltage is applied, directly by a voltage across the respective load element of the respective path of the MOS differential amplifier stage.

2. The BiCMOS operational amplifier as claimed in claim 1, wherein the reference current through the MOS differential amplifier stage is selected such that the reference current is less than or equal to respective currents in the output paths, and the output of the operational amplifier is fed back to an output of the MOS differential amplifier stage via a compensation capacitance.

3. The BiCMOS operational amplifier as claimed in claim 1, wherein each of the load elements in the respective output paths have a transistor, and these the transistors being connected in the form of a current mirror, and wherein the load element connected to the output of the operational amplifier has an additional load element which is connected in series with a respective transistor of the current mirror.

4. The BiCMOS operational amplifier as claimed in claim 3, wherein the additional load element is an MOS transistor whose gate is driven by a third reference voltage.

5. The BiCMOS operational amplifier as claimed in claim 4, wherein the current source for the reference current is a PMOS transistor whose gate is driven by a fourth reference voltage.

6. The BiCMOS operational amplifier as claimed in claim 5, wherein the first, second, third and fourth reference voltages are formed in a reference unit which is constructed such that:

the first reference voltage is applied to the base of a first bipolar transistor, the emitter of the first bipolar transistor being connected to an external reference potential via a first NMOS transistor, the collector of the first bipolar transistor being connected to a supply voltage via a first PMOS transistor, and the base of the first bipolar transistor being connected to the collector of the first bipolar transistor and to the gate of the first NMOS transistor;

the second reference voltage is applied to the gate of a second NMOS transistor, the first terminal of which the second NMOS transistor being connected directly to the external reference potential, the second terminal of the second NMOS transistor being connected to the supply voltage via a second PMOS transistor, and the gate of the second NMOS transistor being connected to the second terminal of the second NMOS transistor;

the third reference voltage is applied to the gate of a third NMOS transistor, the first terminal of the third NMOS transistor being connected directly to the external potential, the second terminal of the third NMOS transistor being connected to the supply voltage via a third PMOS transistor, and the gate of the third NMOS transistor being connected to the second terminal of the third NMOS transistor; and the fourth reference voltage is applied to the gates of the first, second and third PMOS transistors and of a fourth PMOS transistor, the first terminal of the fourth PMOS transistor being connected directly to the supply voltage, the second terminal of the fourth PMOS transistor being connected to the external reference potential via a fourth NMOS transistor, and the gate of the fourth PMOS transistor being connected to the second terminal of the fourth PMOS transistor, the gate of the fourth NMOS transistor being connected to the supply voltage.

7. The BiCMOS operational amplifier as claimed in claim 1, wherein the respective load elements in the respective paths of the MOS differential amplifier comprise NMOS transistors which are connected as diodes.

* * * * *